(12) United States Patent
Motwani

(10) Patent No.: US 8,549,382 B2
(45) Date of Patent: Oct. 1, 2013

(54) STORAGE DRIVE WITH LDPC CODING

(75) Inventor: Ravi H. Motwani, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 320 days.

(21) Appl. No.: 12/971,831

(22) Filed: Dec. 17, 2010

(65) Prior Publication Data

US 2012/0159285 A1    Jun. 21, 2012

(51) Int. Cl.
*G06F 11/00* (2006.01)

(52) U.S. Cl.
USPC ............................................ 714/767; 714/763

(58) Field of Classification Search
USPC ................... 714/6.2, 6.22, 6.24, 763, 767
See application file for complete search history.

(56) References Cited

U.S. PATENT DOCUMENTS

| | | | |
|---|---|---|---|
| 6,173,415 B1 * | 1/2001 | Litwin et al. | 714/5.1 |
| 8,239,734 B1 * | 8/2012 | Shalvi | 714/770 |
| 8,250,433 B2 * | 8/2012 | Wylie et al. | 714/758 |
| 8,327,224 B2 * | 12/2012 | Larsen et al. | 714/763 |
| 2010/0199149 A1 * | 8/2010 | Weingarten et al. | 714/773 |
| 2011/0219259 A1 * | 9/2011 | Frost et al. | 714/6.2 |
| 2012/0005558 A1 * | 1/2012 | Steiner et al. | 714/773 |
| 2012/0079355 A1 * | 3/2012 | Patapoutian et al. | 714/780 |
| 2012/0159281 A1 * | 6/2012 | Shalvi et al. | 714/755 |
| 2012/0272000 A1 * | 10/2012 | Shalvi | 711/114 |

FOREIGN PATENT DOCUMENTS

WO    2010039859 A1    4/2010

* cited by examiner

*Primary Examiner* — Marc Duncan
(74) *Attorney, Agent, or Firm* — Erik R. Nordstrom

(57) ABSTRACT

For storage drives with LDPC encoded data, read techniques are provided whereby an errantly read memory unit (e.g., faulty LDPC codeword) may be recovered.

11 Claims, 6 Drawing Sheets

STORAGE DRIVE WITH LDPC CODING

TECHNICAL FIELD

The present invention relates generally to storage drives and in particular, to flash drives such as solid-state NAND flash drives with LDPC (low-density parity-check encoded) data.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

For storage drives, e.g., NAND flash storage drives with LDPC encoded data, read techniques are provided whereby an errantly read memory unit (e.g., faulty codeword) may be recovered. In some embodiments, extra redundancy is built into the system in that an additional memory module with XOR values of corresponding LDPC codewords from the other memory modules (e.g., dies) making up the storage drive, is provided enabling recovery of an errantly read codeword. With such decoding using the XOR information, improved UBER (unrecoverable bit error rate) performance may be attained.

Figure 1:
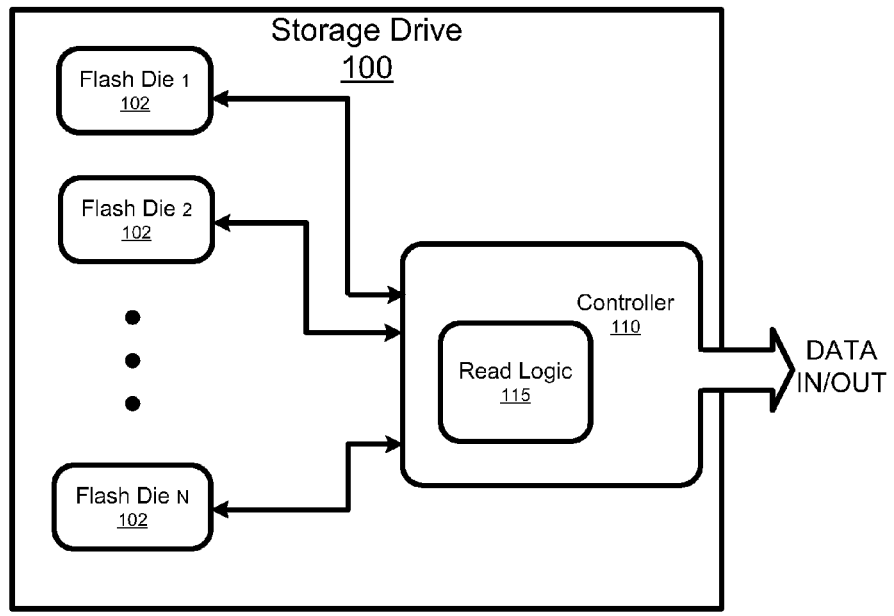
FIG. 1 is a diagram of a storage drive with LDPC coding in accordance with some embodiments.

FIG. 1 shows a storage drive 100 in accordance with some embodiments. It generally comprises N memory modules (NAND flash dies in this depiction) 102 and a controller 110 with read logic 115 to read a requested unit of data from the memory modules and provide them to a requesting agent such as a host for a computing platform that includes the storage drive. For example, the storage drive may be a so-called solid-state drive with the memory modules implemented with NAND flash dies. However, any suitable read/writeable memory technology, known today or in the future, may be employed. (Note that computing platform refers to any suitable computing device such as a server, a personal computer, a portable computer, a smart phone, or the like, that uses storage drives such as solid-state flash drives, portable flash drives, etc.) For convenience, the term "die" will be used, in the context of NAND flash, for ease of description, but it should be appreciated that the invention is not so limited.

N separate dies are provided for the storage drive memory. In some embodiments, not all of the N dies may be required to provide unique memory locations. In such cases, the excess die(s) may be used to store redundant data corresponding to data stored in the memory location dies so that errantly read data may be recoverable. For example, there could be a total of 41 dies, with the first 40 dies used to provide memory-space for a user or agent of the storage drive, and the Nth die ($41^{st}$ in this example) may be used for redundant data. (Note that a redundant die, also in this disclosure referred to as an "XOR" die, may result from a separate die provided for use as an XOR die, or alternatively, it could result from a left-over back-up die that was available for memory-space use but is ultimately determined not to be needed since enough other dies were determined not to be defective.)

Figure 2:
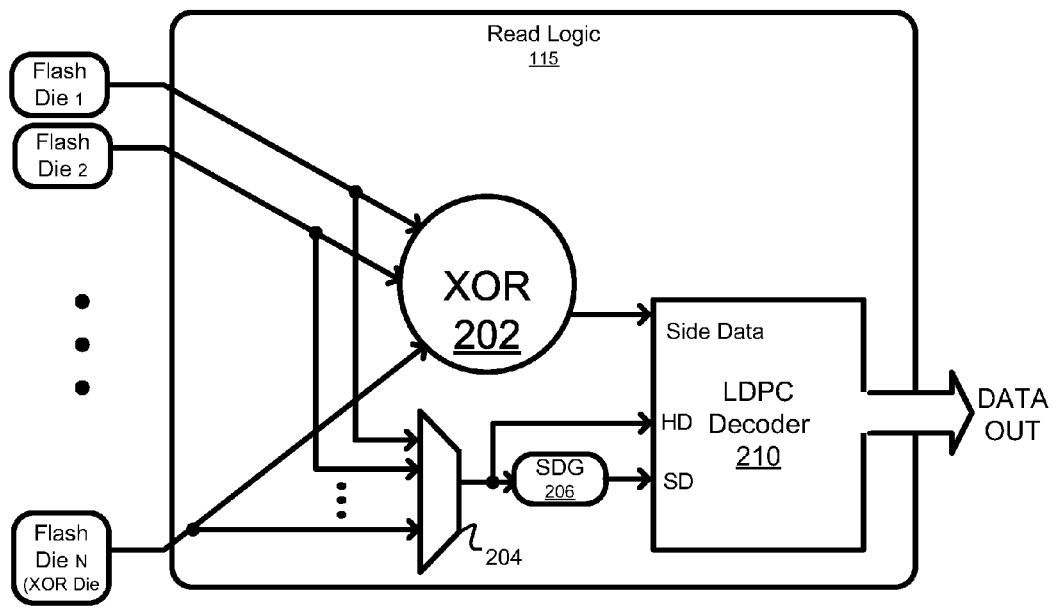
FIG. 2 shows a more detailed implementation of the storage drive of FIG. 1 with XOR data recovery capability in accordance with some embodiments.

FIG. 2 shows a more-detailed implementation of the storage drive of FIG. 1, with a focus on the read logic 115. The read logic 115 comprises XOR logic 202, a multiplexer 204, a soft data generator 206, and an LDPC decoder 210, coupled together as shown. In the depicted embodiment, LDPC coding is used to store data in the storage drive. LDPC (low-density parity-check) coding is a linear error-correcting coding scheme. It provides a method for transmitting data, such as data stored on the depicted storage drive, through a noisy transmission environment, e.g., within the flash storage drive. The storage drive may store its data, in the form of LDPC codewords, on the first N−1 dies, with the Nth die used for redundant, XOR data that may be used to recover invalid codewords.

Each codeword typically occupies two flash die sectors, e.g., about 1K Bits of data. The Nth (XOR) die includes the XOR'ed result of its corresponding codewords from the memory space dies (Die 1 through Die N−1). So, for example, if each memory space die had one million codewords, there would be a total memory storage capacity of 40 million codewords (for the N=41 example), with the XOR die containing one million XOR codewords, each corresponding to the logical XOR'ing of the corresponding codewords from each of the other 40 dies.

The multiplexer allows the read logic to read a desired codeword from a selected memory space die. it can read the codeword as "hard" data (taking the 0's as 0's and 1's as 1's) or as soft data, from the soft data generator. Soft data not only indicates whether a bit is a '1 or a '0, but also, it includes probability, e.g., probability ratio, information indicating the likelihood that the bit is a '1 or a '0. Persons of ordinary skill with flash memory should understand soft data principles.

The soft data generator may be controlled to change Flash threshold levels and generate different values with different probabilities. This allows for the flash storage/read parameters to be changed to enhance reliability and/or performance for a given environment.

The LDPC decoder decodes the read codeword and determines if it is valid or not, based on LDPC criterion. For example, it may fail an LDPC "syndrome" test, or it may not comply with its CRC value. If there is a decode failure, e.g., in die 1, the codewords from the other dies (Die 2 through die 40 and the XOR Die) are read. (Note that an LDPC decode failure is also referred herein as a fatal or an invalid read.) These readout bits are XOR'ed through XOR logic 202 and the result is used as side information, along with soft information for the failed codeword, to perform additional LDPC decoding to recover the valid codeword.

The information from the "other" dies can be used in various ways. For example, the readout bits (un-decoded noisy codewords) from the other dies can be directly XOR'ed, or they can be first decoded. Alternatively, the passed codewords for the other dies and the un-decoded inputs for the failed codewords for the other dies could be XOR'ed. In addition, the effective residual bit error rate (RBER) can be computed for the hard, side information. The soft information and side information can then be combined since the RBER of the side information is known.

Figure 3:
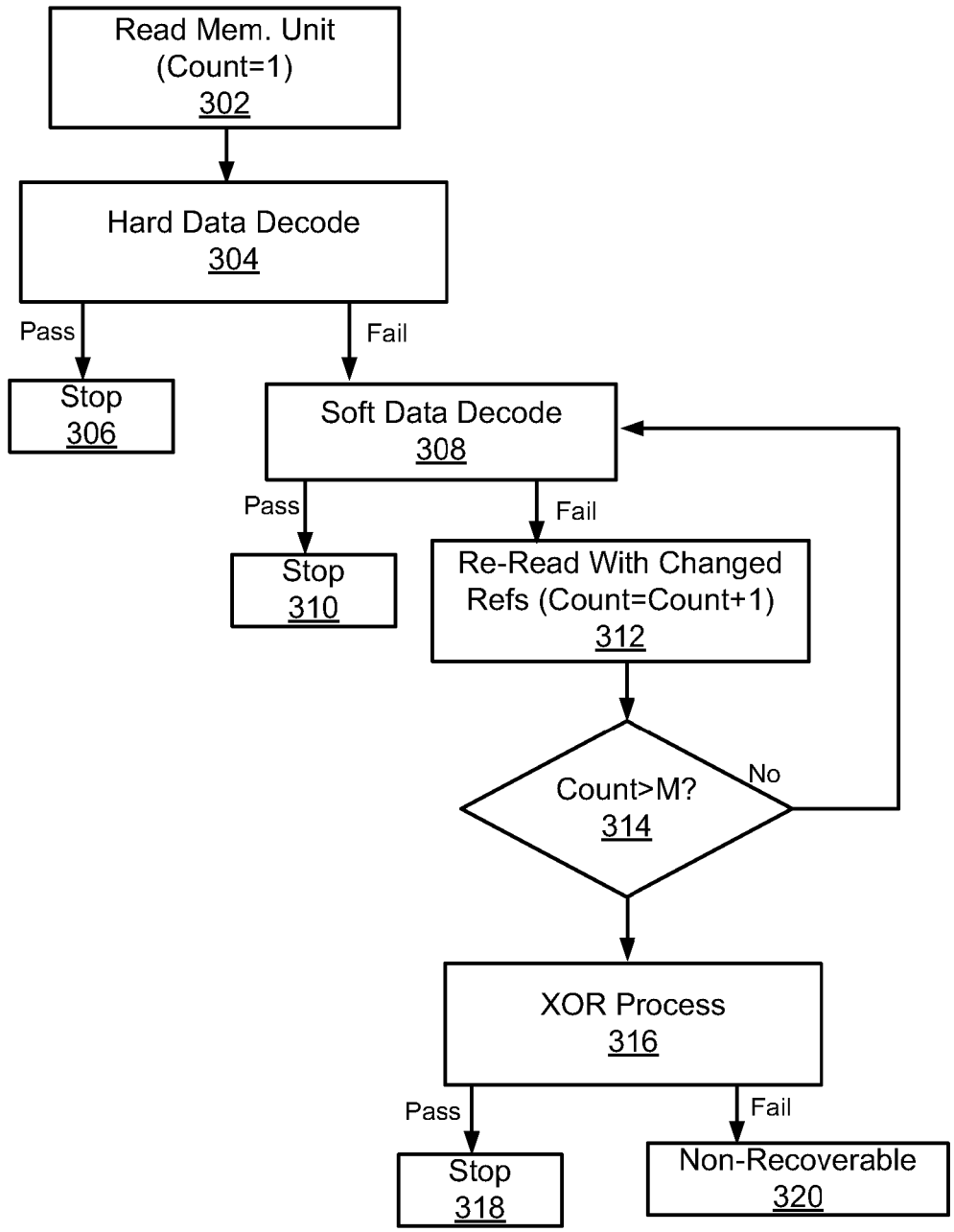
FIG. 3 is a flow diagram of a routine for reading a codeword from the storage drive of FIG. 1 in accordance with some embodiments.

FIG. 3 shows a routine for reading a codeword from a storage driver such as the ones shown in FIGS. 1 and 2. Initially, at 302, a memory unit (codeword) is read. That is, it is retrieved for a hard data decode (HDD) and a count is set to 1. At 304, a hard data decode is performed on the codeword. If it passes, then as indicated at 306 the read is done, the read codeword is valid. On the other hand, if it failed, then at 308, a soft data decode is performed for the read codeword.

Figure 4:
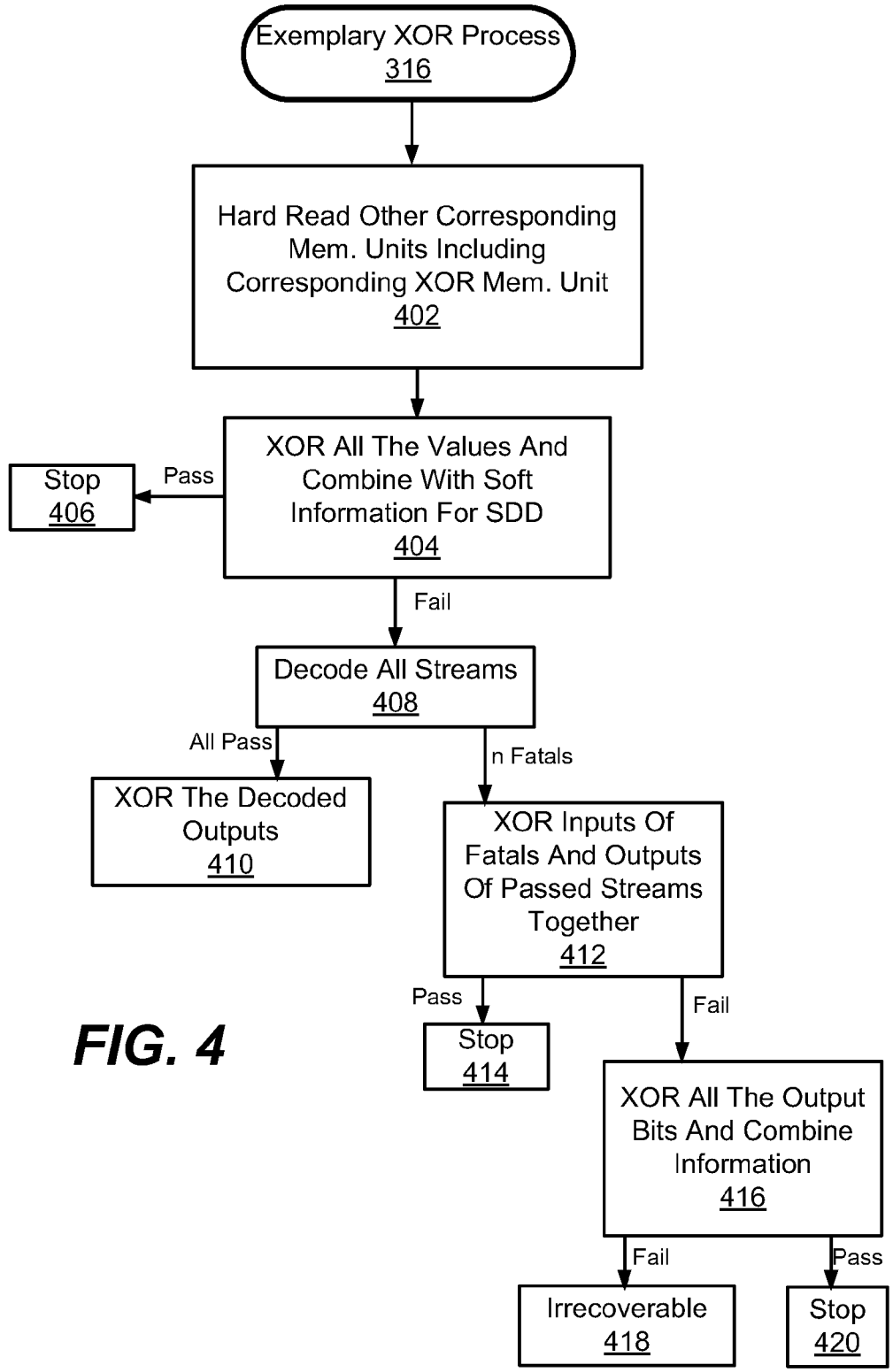
FIG. 4 is a flow diagram of an XOR process for the read routine of FIG. 3 in accordance with some embodiments.

If that soft data decode passes (LDPC criterion), then again, the read can be completed with the codeword being valid. On the other hand, if the SDD failed, then at 312, the codeword is re-read with the soft data thresholds tweaked to hopefully, enhance data accuracy. The Count is also incremented. At 314, if the Count is not above a predefined maximum (M) value, then the routine loops back to 308 and proceeds with a soft data decode as already discussed. On the other hand, if the Count hits M (counts out), then an XORing process, using the other die codewords corresponding to the read codeword, is performed at 316. FIG. 4 shows an exemplary XORing process that may be used at this point. If the XORing, works, then the read is complete and a valid codeword is attained. On the other hand, if it fails, then the codeword is deemed to be unrecoverable.

FIG. 4 shows a routine for performing an XORing process as just discussed. At 402, a hard read is performed on the corresponding codewords from the other dies including the XOR die. At 404, the values are XOR'ed and combined with soft information from the codeword to be read, itself, for implementing soft data decoding. (See FIG. 5 for an example of how this process may be performed.)

At 408, the streams (a.k.a codewords or channels) from the other dies are decoded. If they all passed, then their outputs are XOR'ed with each other at 410. On the other hand, if the separate codewords from the other dies, when decoded, did not all pass, then at 412, their inputs (inputs for decoded streams that did not pass) and the outputs of the ones that passed are XOR'ed with each other. (See FIG. 6 for an example of how this procedure may be performed.)

If the decoded result passes, then the process is complete at 414. On the other hand, if it fails, then at 416, the output bits are all XOR'ed and combined. (See FIG. 7 for an example of how the data may be combined for this procedure.) If the result passes, then the read codeword is attained and recoverable (418). On the other hand, if not, then the codeword is not recoverable (420).

Figure 5:
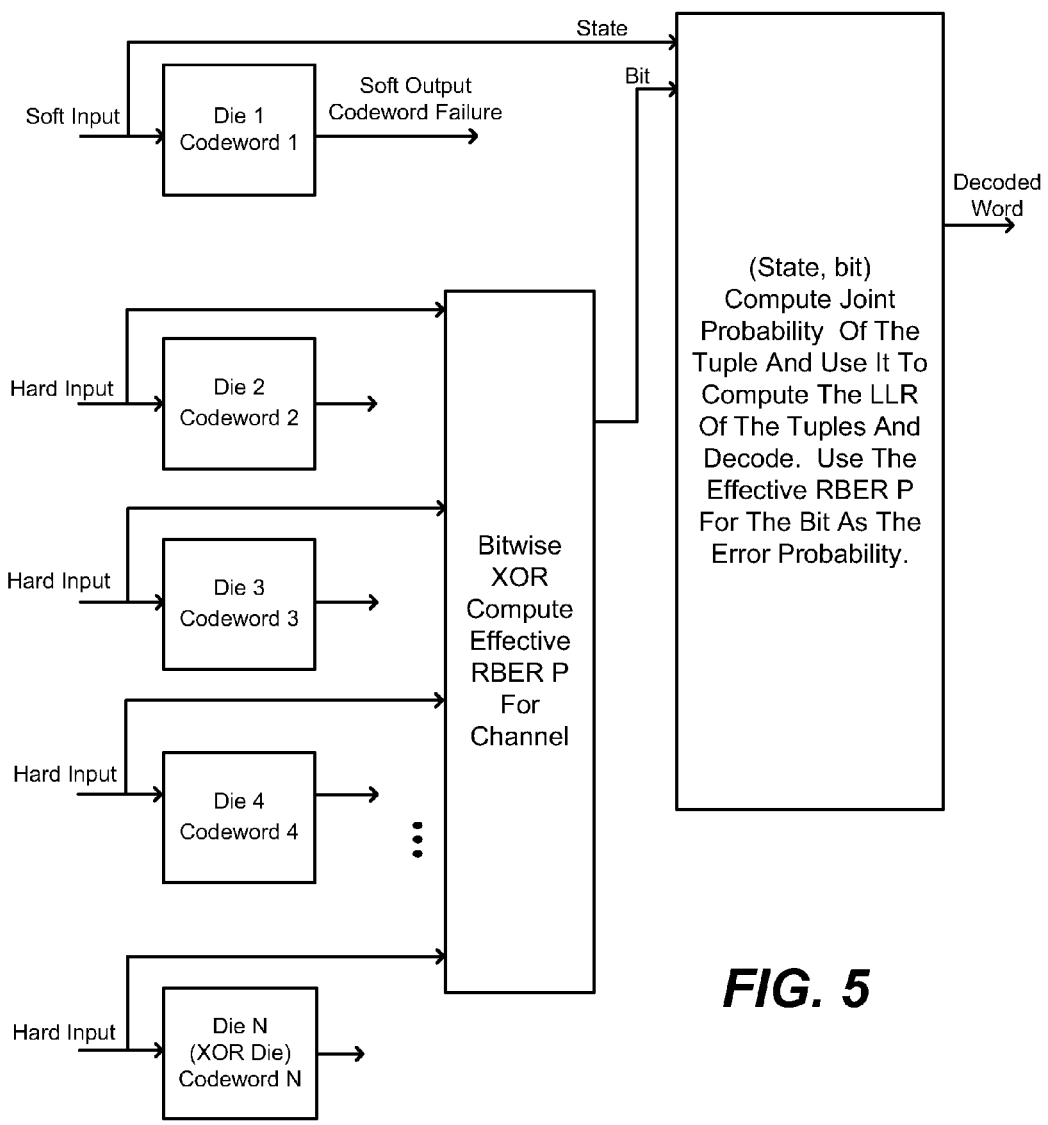
FIG. 5 is an exemplary process for generating an LLR (log likelihood ratio) value for input combining in accordance with some embodiments.

FIG. 5 shows an exemplary scheme for performing the XOR'ing and combining of 404. The noisy hard codeword inputs (before decoding) are XOR'ed with each other to generate side information. The RBER for the side information channel can be computed from the RBER of the individual input streams using, e.g., binomial distribution. The conditional joint probability of the soft and the side information can then be computed using this effective RBER value.

The LLR's can also be computed for each of the joint state from this conditional joint probability. This scheme can give an improvement of 3.5×RBER if it is assumed that the individual channels have an RBER from a log-normal distribution.

Figure 6:
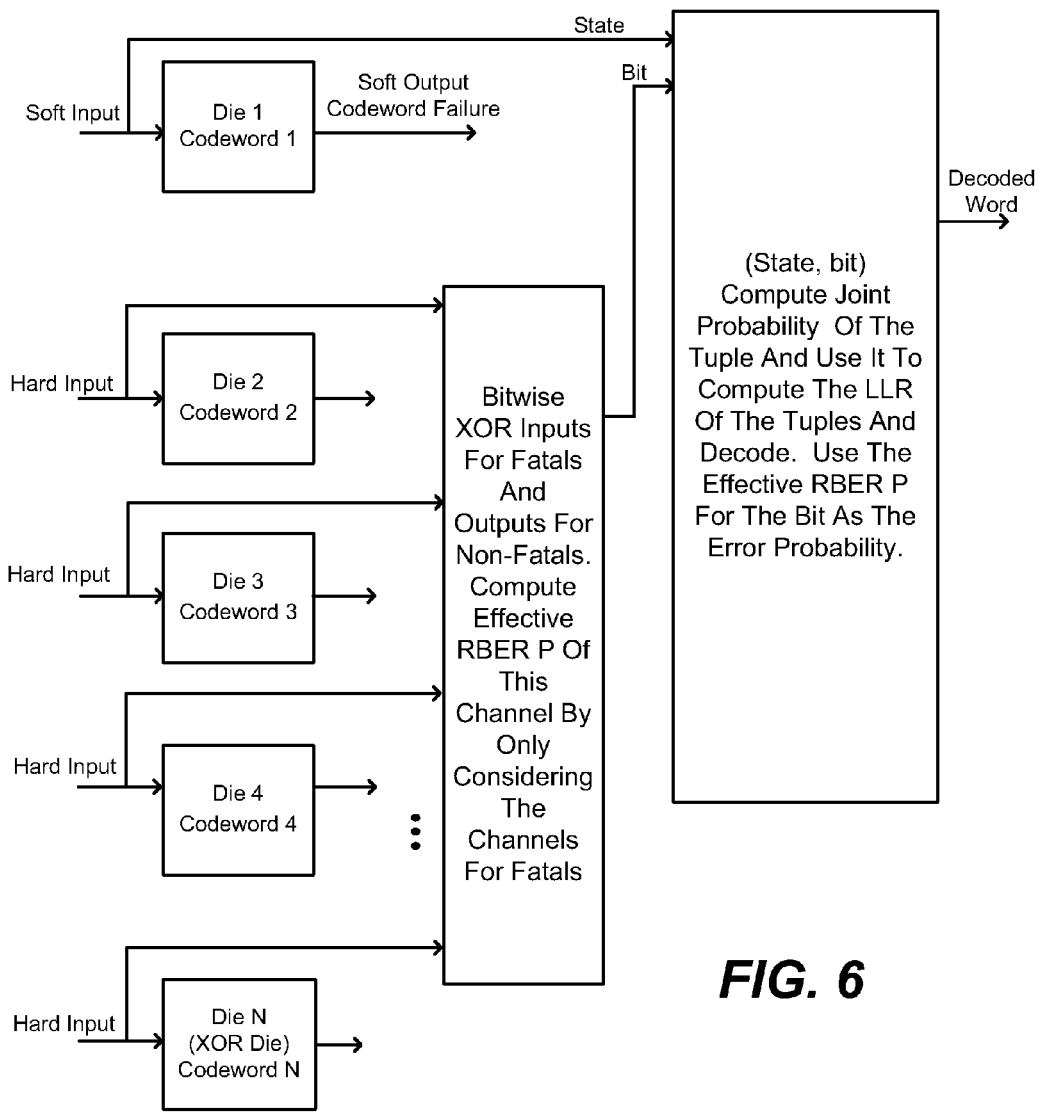
FIG. 6 is an exemplary process for generating an LLR value for input combining for fatals and output combining for non-fatals in accordance with some embodiments.

FIG. 6 shows an exemplary process for generating LLR value for input combining for fatals and output combining for non-fatals (412 from FIG. 4). In this scheme, the inputs for the streams (other-die codewords) that have codeword failures, and the outputs for the streams whose codewords pass syndrome, are XOR'ed with each other. The effective RBER is then computed by only considering the streams with fatals.

Figure 7:
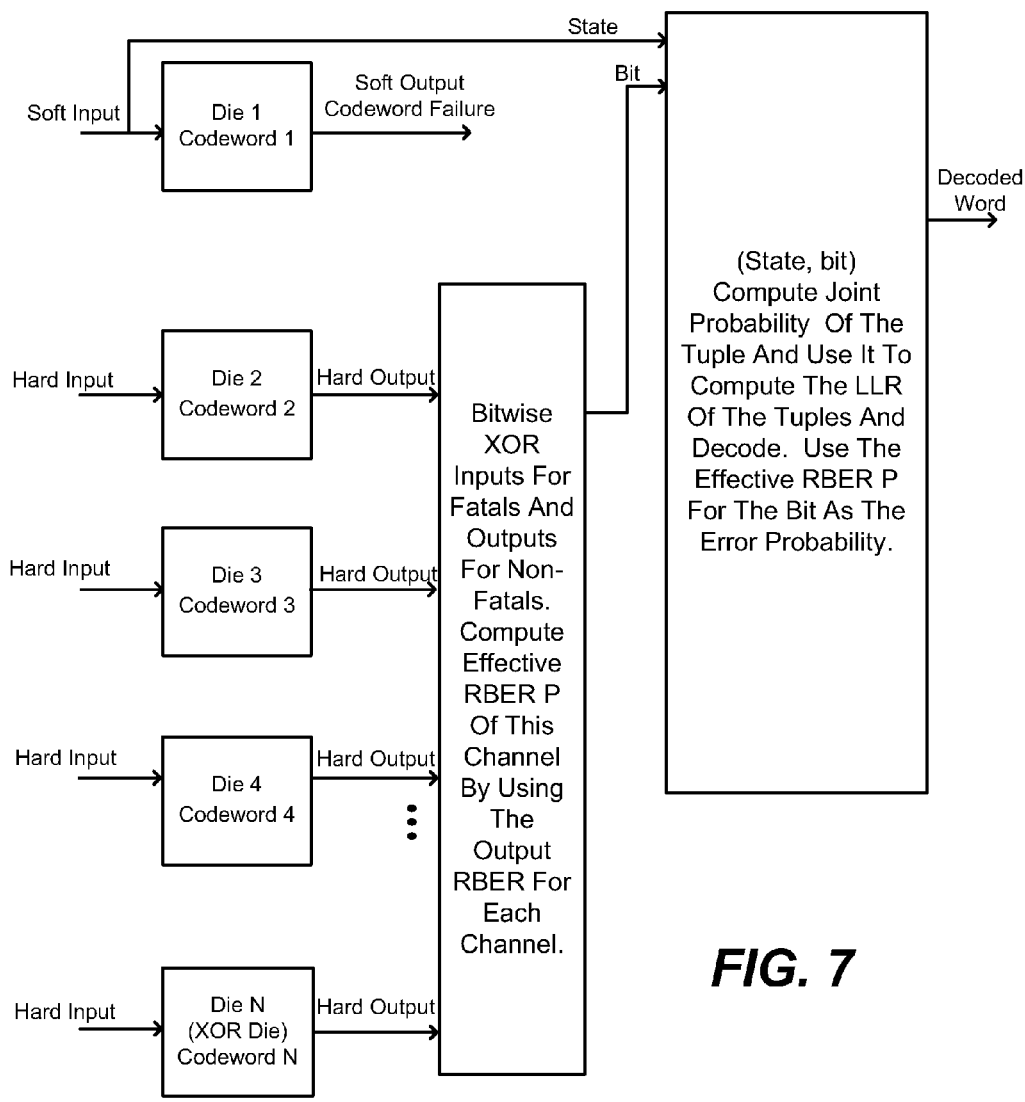
FIG. 7 is an exemplary process for generating an LLR value for output combining in accordance with some embodiments.

FIG. 7 shows an exemplary process for generating an LLR value for output combining (416 from FIG. 4). In this scheme, the outputs for all the streams (corresponding other-die codewords) are XOR'ed with each other. The effective RBER for the side information streams (other-die codeword streams) is computed by considering the output RBERs for all the combining streams.

(Note that the above schemes could also be generalized to handle soft information for the combining streams.)

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus, comprising:
   a plurality of memory-space memory modules to provide read/writeable memory for storing codewords of LDPC-coded data;
   at least one redundancy memory module to store redundant information for the codewords; and
   read logic to read a selected codeword and if the read codeword is invalid, recover it using codewords from the other memory-space modules and the redundancy module;
   wherein the redundancy module comprises codewords of XOR results for corresponding codewords from the plurality of memory-space codewords, wherein the read logic is to (1) initially read the selected code word using hard data decoding (HDD), (2) read the selected code word using soft data decoding (SDD) if the HDD read is invalid, the SDD reading including re-reading the selected codeword using different NAND flash references if a previous SDD read is invalid, and (3) if the SDD read fails, to HDD read the selected codeword by combining valid HDD-read corresponding codewords with soft data corresponding codeword inputs whose LDPC HDD decodes failed.

2. The apparatus of claim 1, in which the memory modules are NAND flash dies.

3. The apparatus of claim 1, in which combining includes XOR'ing the valid HDD read corresponding codewords with soft data codeword inputs for corresponding codewords whose LDPC decodes failed.

4. An apparatus, comprising:
   a plurality of NAND flash dies to provide read/writeable memory-space for storing codewords of LDPC-coded data;
   at least one NAND flash die to store codewords of redundant information for the codewords; and
   logic to read a selected memory-space codeword and if the read codeword is invalid pursuant to LDPC decoding, then to recover its data using corresponding codewords from other memory-space dies and from the redundancy die, wherein said using includes XORing corresponding codewords derived from HDD and corresponding codewords derived from SDD after HDD failed.

5. The apparatus of claim 4, in which the redundancy die comprises codewords of XOR results for corresponding codewords for the plurality of memory-space dies.

6. The apparatus of claim 5, in which the read logic is to initially read the selected code word using hard data decoding (HDD).

7. The apparatus of claim 6, in which the read logic is to read the selected code word using soft data decoding (SDD) if the HDD read is invalid.

8. The apparatus of claim 7, in which the read logic is to re-read the selected codeword using soft data decoding (SDD) but with different NAND flash references if a previous SDD read is invalid.

9. The apparatus of claim 8, in which the read logic is to read the selected codeword by HDD reading corresponding codewords from other memory-space dies and the redundancy die and XOR'ing the reads together if they were valid.

10. The apparatus of claim 4, in which the dies and read logic are part of a solid-sate storage drive.

11. The apparatus of claim 10, in which the dies and read logic are part of a solid-sate storage drive in a computing platform.

* * * * *